Aug. 16, 1966 A. J. REGEFFE 3,267,340

MICROWAVE SEMI-CONDUCTOR DEVICE

Filed May 25, 1961

Inventor:
André J. Regeffe
By Kemon, Palmer,
Stewart & Estabrook
Attorneys 3,267,340
MICROWAVE SEMI-CONDUCTOR DEVICE André J. Regeffe, Paris, France, assignor to Societe Lignes Telegraphiques et Telephoniques, a corporation of France Filed May 25, 1961, Ser. No. 126,371
Claims priority, application France, June 9, 1960, 829,445, Patent 1,267,262
5 Claims. (Cl. 317—234)

The invention relates to an improved microwave diode used as a high power detector. As is well known, one of the main difficulties for the user of microwave diodes is burn-out, that is, destruction of the detecting properties of the diode by high inverse voltage once it has received an energy level in excess of a maximum value which is rather low. Burn-out occurs even under pulsed operation. This drawback finds its reason in the structure of this kind of device. Indeed, microwave detectors are of the point contact type, with the contact area reduced to a minimum in order to minimize the interelectrode capacitance. This fragility is, of course, very objectionable from the operator's point of view since it may happen that the detector of one equipment be burnt out by the transmitter of a nearby equipment through direct coupling.

It is an object of the present invention to increase the burn-out level of microwave diode detectors while preserving their high sensitivity at low level.

A microwave diode is a point contact diode in which a rectifying contact is welded or not to a semiconductor, rectification being achieved as is well known, through the formation of a micro-junction at the point contact either by doping or by thermal conversion, in a very small area surrounding the point contact. By micro-junction, I mean a junction the surface of which is small, about $10^{-4}$ mm.$^2$. A double Zener diode is identical to two Zener diodes connected in opposition. The double Zener diode is able to rectify low or high frequency currents when operated on a points of its characteristic above the knee corresponding to avalanche break-down. In this operating zone the internal resistance of the double Zener diode is very low since it acts as a voltage stabilizer.

According to the present invention, there is provided a high burn-out microwave detector which comprises the following components associated on a common semiconductor wafer: a point contact microwave diode; a point on the semiconductor wafer which is maintained at a fiexd potential during operation, said point being located near the point contact of said microwave diode; and a double Zener diode, the contact area of which is more remote from the fixed potential point than the point contact of the microwave diode. The double Zener diode comprises a large area junction and an alloyed junction of smaller dimension, the resistance between the alloyed junction contact and the output electrode being high with respect to the microwave diode cat-whisker resistance. According to an auxiliary feature of the invention, the point at fixed potential is provided on the surface of the semiconductor pellet by fusing a lead of low resistivity, the other end of which is connected to earth.

According to the essential characteristic of the inventiontion, the impedance of the different components which have been enumerated above are related as follows:

$$R_3 << R_1 < R_2$$

and $$\sqrt{R^2+\frac{1}{C^2W^2}}=\sqrt{R'^2+\frac{1}{C'^2W^2}}$$

where:

$R_3$ is the internal resistance of the double Zener diode when operated between the knees of its characteristic.

$R_1$ is the transverse resistance across the bulk semiconductor between the point contact of the microwave diode and the fixed potential point.

$R_2$ is the transverse resistance across the semiconductor between the contact area of the double Zener diode and the fixed potential point.

R and R′ are respectively the series resistances of the double Zener diode and the microwave diode.

C and C′ are the corresponding capacitances, and

W is equal to $2\pi F$ where F is the operating frequency.

These equations are true providing the following assumption is made: the series inductances of the microwave diode and double Zener diode can be neglected with respect to their equivalent impedance. This condition is almost alway verified in practical devices.

The present invention will now be described in greater detail by way of example with reference to the accompanying drawing wherein.

Figure 1:
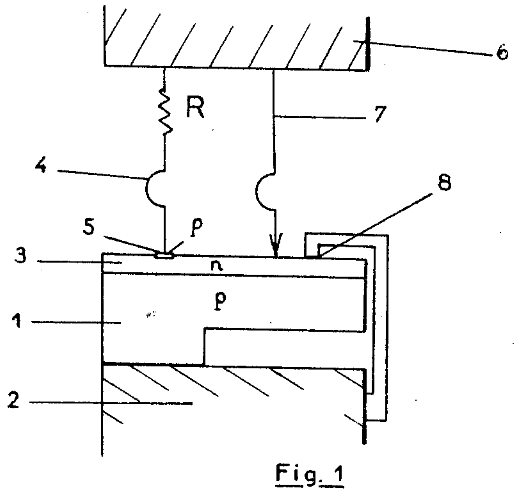
FIGURE 1 is a schematic view explaining the operation of a device according to the invention.

FIGURE 1 shows a p-type semiconductor wafer 1 in ohmic contact with a bulk electrode 2 for instance through soldering. The wafer is L-shaped and bears a shallow n-zone 3 near the face opposite to electrode 2. One end of a cat-whisker 4 is placed on the upper face of the wafer to establish a rectifying contact with the n-zone 3 through a restricted alloyed p-zone 5. Wire 4 is made of a high resistivity material and is in ohmic contact with p-zone 5. The contact between the p-zone 5 and n-zone 3 constitutes a restricted area junction, and the contact between n-zone 3 and p-type bulk 1 constitutes a large area junction. The equivalent resistance of the cat-whisker 4 is represented as R in the figure. The other end of cat-whisker 4 is connected to a second output electrode 6. A second cat-whisker 7 of a much smaller diameter establishes a rectifying point contact with the upper face of n-zone 3 to constitute the microwave diode, the formation of said detector being obtained by any well-known process. The formation process establishes the rectifying properties of the contact through the formation of a very small area of p-type semiconductor surrounding the tip of the whisker as is well known. The cat-whisker 7 is connected at its opposite end to electrode 6. The upper face of the n-zone 3 is in ohmic contact with a lead 8 near the point contact of the cat-whisker 7. The other extremity of the lead 8 is welded or brazed to either electrode 2 or 6 according to the polarity of the diode to be obtained, contact being provided with the output connection which is operated at earth potential.

Figure 2:
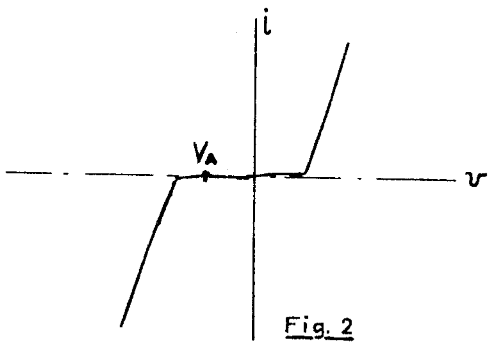
FIGURE 2 illustrates the operating characteristic of a double Zener diode.

FIGURE 2 shows the current-voltage characteristic of the double Zener diode constituted by the cat-whisker 4, the p-type zone 5, the n-type zone 3, and the p-type bulk 1.

Operation of the device represented in FIGURE 1 may be explained as follows. A D.C. potential reference is established by the electrode 2. Assuming that the potential drop between the ends of lead 8 is negligible, a given point on the upper face of n-zone 3 is maintained at earth potential. When microwave energy is received in such a device, current flows in whiskers 4 and 7 from electrode 6 towards the semiconductor. Since the whisker 7 constitutes together with n-zone 3 a conventional microwave diode, the contact capacitance may be considered as negligible. The capacitatnce between the cat-whisker 4 and the n-zone 3, that is the capacitance of the junction between the p-zone 5 and the n-zone 3 is much larger owing to the geometrical dimensions. Charges will build up across this capacitance and therefore the potential at the contact point of whisker 4 on the semiconductor will be higher than the potential at the contact point between whisker 7 and the semiconductor. The electrons flowing through 4 are accumulated at the contact of 4 with the semiconductor. Some of them will flow in the n-zone 3 along the potential gradient in this layer due to the potential difference between point 8 and the contact area 5 between cat-whisker 4 and the semiconductor. This potential difference is due to the voltage drop across resistor R in series with cat-whisker 4. Transverse resistance between the end of 7 and the lead 8 is smaller than the transverse resistance between the end of 4 and 8 as may easily be seen from relative position of these points in FIGURE 1. This kind of operation will continue as long as the potential at the point of contact of cat-whisker 4 on the semiconductor is lower than the Zener knee voltage of the diode as at $V_A$ in FIGURE 2. When the knee value is reached, the internal resistance $R_3$ of the diode will abruptly decrease, and the charge which had accumulated at the end of a cat-whisker 4 will flow through $R_3$. The microwave diode is shunted by R plus a very low impedance $R_3$ which prevents the potential at the point contact of the whisker 7 from increasing. The double Zener diode protects the microcwave diode against burn-out as soon as the microwave energy level is higher than the value which corresponds to a bias of the Zener diode equal to twice the Zener knee voltage.

At the operating microwave frequency, the two diodes correspond to impedances of the type.

$$Z=\sqrt{R^2+\left(LW-\frac{1}{CW}\right)^2}$$

which are parallel connected. Therefore, the rectified current flow is divided between the two diodes. In order to avoid a decrease in the sensitivity of the microwave diode, the impedances of both diodes are to be nearly equal. It is well known in the art that microwave diodes can be obtained with negligible inductance value. Therefore, one may write:

$$Z=\sqrt{R^2+\frac{1}{C^2W^2}}$$

By fabrication the capacitance of the double Zener diode is much larger than that of the microwave diode. Therefore the resistive part of the impedance of the Zener diode should be large with respect to the same part of the microwave diode impedance. This condition is obtained by choosing high resistivity material for whisker 4, and by locating the contact area of the Zener diode junction at the semiconductor wafer surface so that the transverse resistance in the n-type zone 3 between the contact of whisker 4 and the lead 8 is higher than the transverse resistance between the point contact of the microwave diode whisker 7 and the lead 8.

Figure 3:
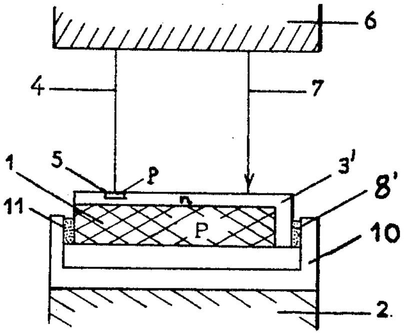
FIGURE 3 is a constructural view of the device shown in FIGURE 1.

FIGURE 3 shows an embodiment of the structure shown in FIGURE 1. This device comprises a semiconductor bar 1, the bulk resistivity of which is p-type. An n-zone 3′ is formed on two faces of the bar, for instance through diffusion of a donor impurity. Such a result may be obtained by lapping out the diffused layer formed on the two other faces of the bar. Ohmic contact with the diffused layer is established at 8′ by means of conductor 10 which is shaped as a bridge, the flat part of which is in ohmic contact with the output bulk electrode, for instance through soldering. The second extremity of conductor 10 establishes an ohmic contact at 11 with the p-type bulk 1 of the bar. The double Zener diode is constituted by whisker 4 in rectifying contact with diffused n-zone 3 through rectifying p-zone 5 of restricted area. The microwave detector diode consists of cat-whisker 7 in rectifying contact with the same diffused n-zone 3′. As shown, the whisker 7 point contact is located near the contact area 8′ between the conductor 10 and the output connection 2, where the latter is maintained at earth potential during operation. In this way, the resistance $R_1$ of the diffused layer between the point contacts of 7 and 8′ is smaller than the resistance $R_2$ between p-zone 5 and the point 8′. The internal resistance value $R_3$ of the double Zener diode depends on the resistivity of the semiconductor and on the geometry of the contact between whisker 4 and the semiconductor. It is easy to obtain $R_3$ much smaller than $R_1$. In a particular embodiment of the invention, the semiconductor bar is made of silicon. Whisker 4 is a tungsten wire which has been oxidized. The p-zone 5 is obtained by a vacuum evaporation of aluminum through a mask. The end of cat-whisker 4 is gilded and contact is obtained through gold diffusion. N-type diffused zone 3′ is obtained by deep diffusion in order to reduce the gradient of majority carrier concentration. The thickness of the layer is reduced by subsequent etching which eliminates the outward layer, the resistivity of which would be too low to obtain a high quality microwave detector. Whisker 7 is made of tungsten or ruthenium-platinum alloy. Diode formation is obtained through discharge of a condenser according to current practice. The bridge 10 is made of gilded "Kovar" (Registered Trade Mark) and the output electrodes are solid copper pellets.

I claim:

1. A high burn-out solid state microwave device comprising:
   (a) a wafer of semiconductor material having a first region of a first conductivity type, a second region of a second conductivity type forming a relatively large area junction wtih said first region a third region of said first conductivity type forming a relatively small area junction with said second region;
   (b) a first conductive member;
   (c) a second conductive member;
   (d) first means for interconnecting said first conductive member and said third region of said wafer;
   (e) second means for interconnecting said first conductive member and said second region of said wafer, said second means being in rectifying contact with said second region of said wafer; and
   (f) bridge means connected to said second conductive member and to said first and second regions of said wafer for forming a double Zener diode with said wafer and said first interconnection means and a microwave diode with said second interconnection means and said second region of said wafer.

2. A high burn-out solid state microwave device comprising:
   (a) a wafer of semiconductor material having a first region of a first conductivity type, a second region of a second conductivity type forming a relatively large area junction with said first region a third region of said first conductivity type forming a relatively small area junction with said second region;
   (b) a first conductive member;
   (c) a second conductive member;
   (d) first means for interconnecting said first conductive member and said third region of said wafer;
   (e) second means for interconnecting said first conductive member and said second region of said wafer, said second means being in rectifying contact with said second region of said wafer, and said second means being located at a point remote from said first means; and
   (f) bridge means for connecting said second conductivity member to said wafer, said bridge means being in large area ohmic contact with said first region for forming a double Zener diode with said wafer and said first interconnection means, and said bridge means being in large area ohmic contact with said second region of said wafer at a point more remote from said third region of said wafer than the contact point of said second interconnection means for forming a microwave diode with said second interconnection means and said second region of said wafer.

3. A high burn-out microwave device according to claim 2 wherein said first interconnection means is a high resistivity cat whisker.

4. A high burn-out solid state microwave device according to claim 2 in which $R_3<<R_1<R_2$ where $R_3$ is the internal resistance of said double Zener diode when operated between the knees of its characteristic, $R_1$ is the transverse resistance between the point contact of said second means with said region of said wafer and the point of connection of said bridge means with said second region, $R_2$ is the transverse resistance between the point of contact of said first means with said third region of said wafer and the point of connection of said bridge means with said second region.

5. A high burn-out solid state microwave device according to claim 2 in which $$\sqrt{R^2+\frac{1}{C^2w^2}}=\sqrt{R'^2+\frac{1}{C'^2w^2}}$$

where R and R′ are the series resistances of the microwave diode and double Zener diode respectively, C and C′ the capacitances of the two diodes and $w=2\pi$ times the operating frequency.

References Cited by the Examiner

UNITED STATES PATENTS 2,889,499 6/1959 Rutz ---------------- 317—235

JOHN W. HUCKERT, *Primary Examiner.*

JAMES D. KALLAM, *Examiner.*

R. F. POLISSACK, *Assistant Examiner.*